(12) United States Patent
Dervisoglu et al.

(10) Patent No.: US 11,313,935 B2
(45) Date of Patent: Apr. 26, 2022

(54) IN-FIELD SOFT MAGNETIC DISTORTION HARDWARE COMPENSATION

(71) Applicant: Apple Inc., Cupertino, CA (US)

(72) Inventors: Gunes Dervisoglu, Santa Clara, CA (US); Christopher D. Guichet, Mountain View, CA (US); Adam S. Howell, Oakland, CA (US); Alexander J. Wiens, San Jose, CA (US); Christopher E. Balcells, Daly City, CA (US); Erik L. Wang, Redwood City, CA (US); Jonathan M. Beard, San Jose, CA (US); Tang Y. Tan, Palo Alto, CA (US); Theodore Lao, Plainfield, IL (US); Tyler S. Bushnell, Mountain View, CA (US); Hung A. Pham, Oakland, CA (US)

(73) Assignee: Apple Inc., Cupertino, CA (US)

( * ) Notice: Subject to any disclaimer, the term of this patent is extended or adjusted under 35 U.S.C. 154(b) by 127 days.

(21) Appl. No.: 16/793,994

(22) Filed: Feb. 18, 2020

(65) Prior Publication Data

US 2021/0072335 A1  Mar. 11, 2021

Related U.S. Application Data

(60) Provisional application No. 62/897,848, filed on Sep. 9, 2019.

(51) Int. Cl.
*G01R 35/00* (2006.01)
*G01R 33/02* (2006.01)
*G01R 33/00* (2006.01)

(52) U.S. Cl.
CPC ....... *G01R 35/005* (2013.01); *G01R 33/0017* (2013.01); *G01R 33/0047* (2013.01); *G01R 33/02* (2013.01)

(58) Field of Classification Search
CPC .......................... G01R 35/005; G01R 33/0017
See application file for complete search history.

(56) References Cited

U.S. PATENT DOCUMENTS

| 4,797,841 A | 1/1989 | Hatch |
| 5,046,031 A | 9/1991 | Wanous |
| 5,165,269 A | 11/1992 | Nguyen |
| 5,187,872 A | 2/1993 | Dufour |
| 7,613,581 B2 | 11/2009 | Skvortsov et al. |
| 7,865,323 B2 | 1/2011 | Hirobe et al. |
| 8,370,097 B2 | 2/2013 | Patel et al. |
| 8,577,637 B2 | 11/2013 | Vogt |
| 9,885,574 B2 | 2/2018 | Moore et al. |

(Continued)

FOREIGN PATENT DOCUMENTS

| CN | 102252689 A | 11/2011 |
| CN | 103308039 B | 8/2015 |

*Primary Examiner* — Alvaro E Fortich
(74) *Attorney, Agent, or Firm* — Dorsey & Whitney LLP

(57) ABSTRACT

A method for calibrating a magnetometer of an electronic device can include detecting a change in a magnetism of the electronic device, collecting a first magnetic field data from the magnetometer at sampling frequency of at least 1 hertz, generating an elliptical calibration model based at least partially on the collected first magnetic field data, collecting a second magnetic field data from the magnetometer, and fitting the collected second magnetic field data to a sphere using the elliptical calibration model.

20 Claims, 10 Drawing Sheets

(56) References Cited

U.S. PATENT DOCUMENTS

| | | |
|---|---|---|
| 10,175,042 B2 | 1/2019 | Diem et al. |
| 10,838,034 B2 * | 11/2020 | Leirens .................. G01P 21/00 |
| 2017/0160086 A1 * | 6/2017 | Kesaniemi ......... G01R 33/0035 |
| 2018/0080768 A1 * | 3/2018 | Vasilyuk ................ G01C 17/28 |
| 2019/0041209 A1 * | 2/2019 | D'Alfonso ........... G01R 35/005 |

* cited by examiner

IN-FIELD SOFT MAGNETIC DISTORTION HARDWARE COMPENSATION

CROSS-REFERENCE TO RELATED APPLICATION(S)

This claims priority to U.S. Provisional Patent Application No. 62/897,848, filed 9 Sep. 2019, and entitled "IN-FIELD SOFT MAGNETIC DISTORTION HARDWARE COMPENSATION," the entire disclosure of which is hereby incorporated by reference.

FIELD

The described embodiments relate generally to electronic devices. More particularly, the present embodiments relate to electronic devices including magnetometers.

BACKGROUND

Electronic devices, such as wearable or mobile devices like smartphones or smartwatches, are often equipped with an electronic or a digital magnetometer that can be used as a part of a compass system. A compass algorithm can calculate and provide a direction or orientation of the device, that is, a compass system including a magnetometer can provide an orientation of the device's reference frame with respect to an inertial reference frame, which can be a "heading" (typically given relative to the Earth's magnetic field). The direction information can be provided for the user's own navigation knowledge, for example, to tell the user which way is north while walking or driving. The direction information can also be beneficial for use by a navigation or a map application that can be running on the device.

The electronic compass can obtain a measurement of the magnetic field that is present in its immediate surroundings as a three-component vector (e.g., having a magnitude in x, y, and z directions), using a 3-axis magnetic sensor. The sensed or measured field contains a magnetic field associated with an inertial reference frame and a magnetic field associated with the device's reference frame. The magnetic field associated with the inertial reference frame can contain a contribution by the Earth's magnetic field, and a contribution by a so-called local interference field or error vector. The local interference field or error vector is both the "hard" magnetic interference contribution of magnetic fields created by components in the local environment of the mobile device and distortions to the Earth's magnetic field created by these components. Similarly, the magnetic field associated with the device's reference frame contains "hard" magnetic interference contributions from any magnetic component near the sensor, such as a loudspeaker that is built into the device. Additionally, the magnetic field associated with the device's reference frame can be distorted by "soft" magnetic components of or near the device, or components made of soft magnetic materials, that can distort the sensed field in various ways depending on the orientation of the device.

SUMMARY

According to some aspects of the present disclosure, a method of calibrating a magnetometer of an electronic device can include detecting a change in a magnetism of the electronic device, collecting a first magnetic field data from the magnetometer at a sampling frequency of at least 1 hertz (Hz), generating an elliptical calibration model based at least partially on the collected first magnetic field data, collecting a second magnetic field data from the magnetometer, and fitting the collected second magnetic field data to a sphere using the elliptical calibration model.

In some examples, collecting magnetic field data can include collecting magnetic field data for at least 2 minutes. The electronic device can be moved about one or more axis while collecting the magnetic field data. The method can further include determining a strength and a direction of Earth's magnetic field based at least partially on the sphere. Detecting the change in the magnetism can include detecting a change in a component removably attached to the electronic device.

According to some examples, a method of calibrating a magnetometer of an electronic device can include detecting a change in a magnetism of the electronic device, collecting magnetic field data from the magnetometer, and generating an elliptical calibration model based at least partially on detecting the change in a magnetism and the collected magnetic field data.

In some examples, detecting the change in the magnetism can include detecting when a component is removably attached to the electronic device. Collecting magnetic field data can further include compensating for movement of the component relative to the electronic device while collecting the magnetic field data. The component can include at least one of a securement band or a case. The change in the magnetism can include a change in a soft magnetism of the electronic device. Detecting the change in the magnetism can include detecting the change in the magnetism based at least partially on a user's response to a prompt. Collecting magnetic field data can include collecting magnetic field data in a background. Collecting magnetic field data can include prompting a user to perform a data collection procedure. Collecting magnetic field data can include collecting magnetic field data from the magnetometer at a sampling frequency of at least 1 Hz. The wearable electronic device can include a smartwatch.

According to some examples, a wearable electronic device can include a housing defining an internal volume, an attachment feature for a removably attachable component including a magnetic material, a magnetometer disposed in the internal volume, and a distortion shield component disposed in the internal volume between the magnetometer and the attachment feature.

In some examples, the wearable electronic device can include a smartwatch. The removably attachable component can include a securement band. The distortion shield can include a polymer material including a magnetic powder dispersed throughout the polymer material. The attachment feature can be disposed on an exterior surface defined by the housing, and the magnetometer can be disposed adjacent to an interior surface of the housing opposite the attachment feature.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
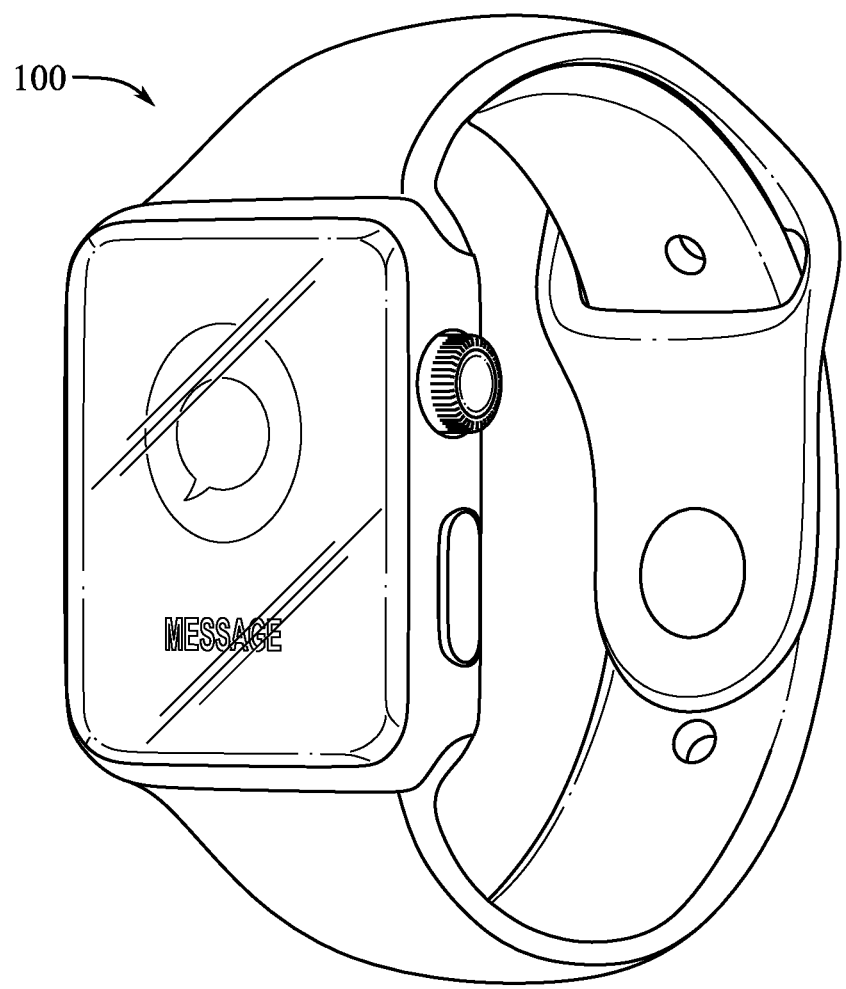
FIG. 1 shows a perspective view of an electronic device.

Reference will now be made in detail to representative examples illustrated in the accompanying drawings. It should be understood that the following descriptions are not intended to limit the examples to one preferred embodiment. To the contrary, it is intended to cover alternatives, modifications, and equivalents as can be included within the spirit and scope of the described examples, as defined by the appended claims.

Electronic devices can include magnetometers, such as three-axis magnetometers, to allow for a number of desired functionalities. In some examples, a magnetometer can be part of a digital compass system of the device. A magnetometer can detect the Earth's magnetic field and can determine the device's orientation relative to the field. Problems can arise, however, due to the presence of materials and components in or near the device that can distort the magnetic field sensed or measured by the magnetometer. These distortions can result in outputs from the magnetometer that do not accurately represent the Earth's magnetic field, and can result in inaccurate or erroneous directional or positional data.

Generally, these magnetic distortions can be present in the form of hard magnetic distortions and soft magnetic distortions. Hard magnetic distortions arise from the presence of hard magnetic materials or components near the magnetometer. Hard magnetic materials, also referred to as permanent magnetic materials or permanent magnets, are materials that retain their magnetic fields after being magnetized and after removal of the applied magnetic field. Accordingly, magnetized hard magnetic materials emit their own magnetic fields. Thus, when a magnetometer is present near a hard magnetic material, it will detect not only the Earth's magnetic field, but also the magnetic field or fields of the hard magnetic materials. Without accounting for the presence of these hard magnetic distortions, the resultant outputs from the magnetometer will be offset by the strength of the hard magnetic field experienced by the magnetometer.

The contribution of the hard magnetic distortion provided by hard magnetic materials that are fixed to the device can be subtracted out of the data collected from the magnetometer as part of a compensation or calibration process when the amount and direction of hard magnetic distortion is known or can be measured. Further, in some devices, a magnetometer can be placed in a device location intended to minimize the exposure of the magnetometer to magnetic fields from hard magnetic materials disposed in the device. Such a location can be near the periphery of the internal volume defined by the housing of the device.

This configuration can present additional complications, however, because placement of the magnetometer in a peripheral location can often place the magnetometer near one or more soft magnetic materials or components. For example, a lug of a securement band of a wearable device can be located in a peripheral location opposite and near a magnetometer when the securement band is attached to the housing of the device. While the lug does not emit or produce its own magnetic field, it can be a soft magnetic material that can cause the magnetometer to experience soft magnetic distortions.

Soft magnetic materials are those materials that can be relatively easily magnetized and demagnetized. For example, soft magnetic materials can have an intrinsic magnetic coercivity of less than about 1000 Amperes/meter (A/m). When included in electronic devices and components, these soft magnetic materials can bend and distort magnetic flux, such as magnetic flux from the Earth's magnetic field and/or from hard magnetic components. Accordingly, when a soft magnetic material is near a magnetometer, the soft magnetic material can bend the flux near the magnetometer and can distort the output from the magnetometer, for example, the output direction of the Earth's magnetic field detected by the magnetometer relative to the actual direction of the Earth's magnetic field at that location. Similar to hard magnetic distortions, however, these soft magnetic distortions can be compensated for if they are known. When soft magnetic distortions are known, data from the magnetometer can be normalized to remove any distortions caused by the soft magnetic materials.

In some situations, however, one or more components including soft magnetic materials, such as a case or a securement component like a band, can be removed from the device and can be replaced by a new or different components including soft magnetic materials. While the magnetometer might have been calibrated, for example, during assembly, for the soft magnetic distortions provided by the original components including soft magnetic materials, subsequently used components can produce different soft magnetic distortions, thereby resulting in reduced or erroneous detection outputs by the magnetometer. Accordingly, it can be desirable for electronic devices to include one or more components and/or to perform one or more methods that can detect when a change in the magnetism of the device, such as a change in the soft magnetic distortion experienced by the magnetometer, has occurred, and to generate a calibration model, also referred to as an elliptical calibration model, that can compensate for the changed distortions experienced by the magnetometer, as described herein.

A method for calibrating a magnetometer of an electronic device, for example, to compensate for changes in the hard and/or soft magnetic distortions associated with changes in one or more components of the device, can include detecting a change in the magnetism of the device and collecting magnetic field data with the magnetometer in the background while the device is operating. The magnetic field data can be collected in the background as the device is moved and rotated during use so that the data collection is not noticeable to a user. An elliptical calibration model based at least partially on the collected data can be generated, and can be used to compensate for the changed magnetism and/or changed magnetic distortions experienced by the magnetometer due to the detected change in magnetism of the device.

These and other examples are discussed below with reference to FIGS. 1-10C. However, those skilled in the art will readily appreciate that the detailed description given herein with respect to these Figures is for explanatory purposes only, and should not be construed as limiting.

FIG. 1 shows an example of an electronic device 100. The electronic device shown in FIG. 1 is a watch, such as a smartwatch. The smartwatch 100 of FIG. 1 is merely one representative example of a device that can be used in conjunction with the components and methods disclosed herein. The electronic device 100 can correspond to any form of wearable electronic device, portable media player, media storage device, portable digital assistant ("PDA"), tablet computer, computer, mobile communication device, GPS unit, remote control device, or other device. The electronic device 100 can be referred to as an electronic device, or a consumer device. Further details of the electronic device 100 are provided below with reference to FIG. 2.

Figure 2:
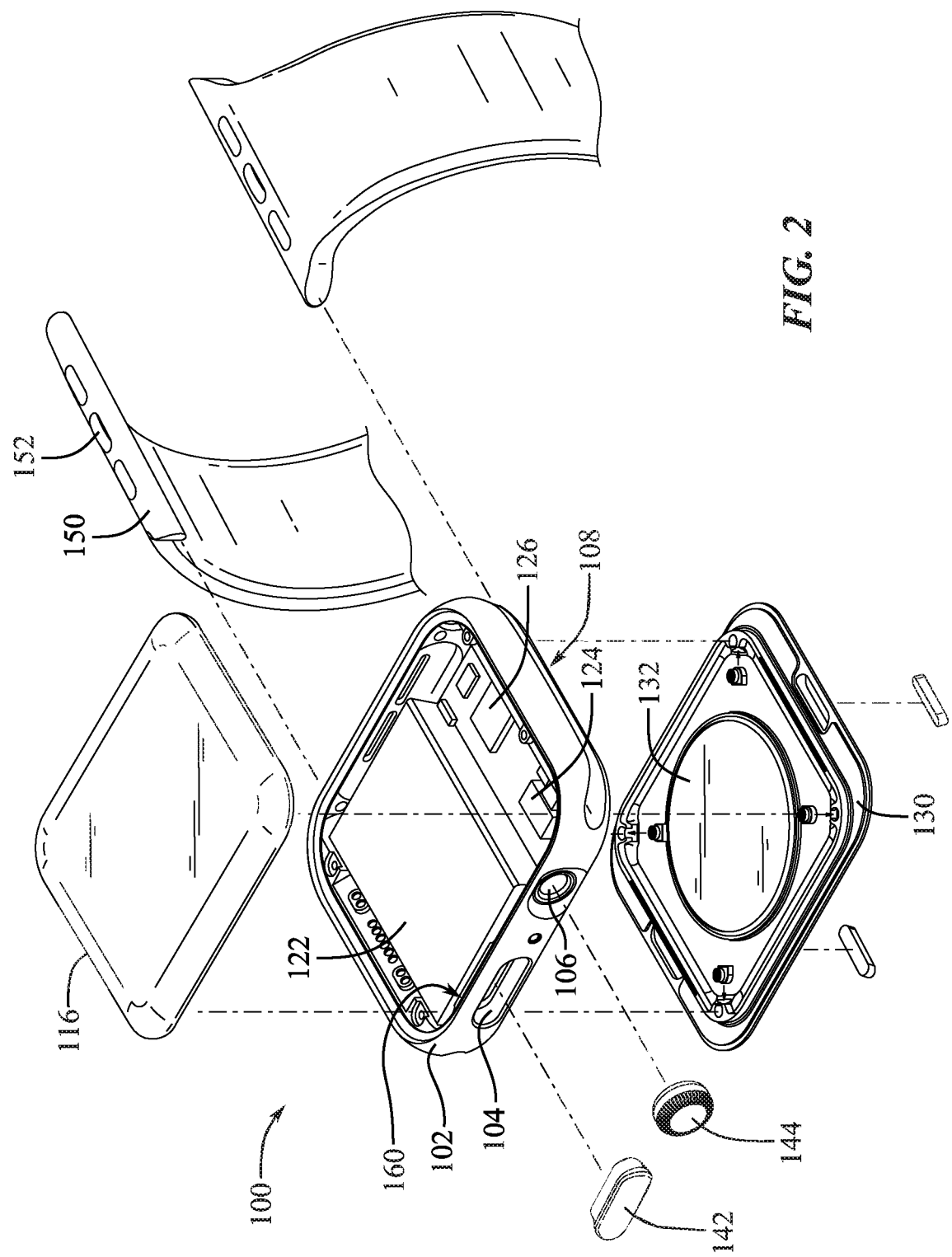
FIG. 2 shows an exploded view of the electronic device of FIG. 1.

Referring now to FIG. 2, the electronic device 100 can include a housing 102, and a cover 116 attached to the housing. The housing 102 can substantially define at least a portion of an exterior surface of the device 100. The cover 116 can include glass, plastic, or any other substantially transparent material, component, or assembly. The cover 116 can cover or otherwise overlay a display, a camera, a touch sensitive surface, such as a touchscreen, or other component of the device 100. The cover 116 can define a front exterior surface of the device 100. A back cover 130 can also be attached to the housing 102, for example, opposite the cover 116. The back cover 130 can include ceramic, plastic, metal, or combinations thereof. In some examples, the back cover 130 can include an electromagnetically transparent portion 132. The electromagnetically transparent portion 132 can be transparent to any wavelength of electromagnetic radiation, such as visual light, infrared light, radio waves, or combinations thereof. The device, such as at the back cover 130, can also include any number or type of sealing components that can serve to prevent the ingress of water or liquid into portions of the internal volume. Together, the housing 102, cover 116, and back cover 130 can substantially define an interior volume and exterior surface of the device 100.

In some examples the back cover 130 can include one or more hard magnetic and/or soft magnetic components therein. For example, the back cover 130 can include a hard magnetic material that can be used to align the wearable device in a desired position when disposed on a stand or base, such as an inductive charging base.

The housing 102 can be a substantially continuous or unitary component, and can include one or more openings 104, 106 to receive components of the electronic device 100 and/or to provide access to an internal portion of the electronic device 100. In some examples, the device 100 can include input components such as one or more buttons 142 and/or a crown 144. In some examples, the housing 102 can include a magnetic material at one or more desired locations. For example, the housing 102 can include a magnetic material at a location corresponding to a desired attachment location 108 of a magnetic component, as described herein.

In some examples, the device 100 can further include a securement component 150. The securement component 150 can serve to secure or affix the wearable device 100 to a desired object, such as the body of a user. In some examples, this securement component 150 can include a band or a strap that can assist in securing the device 100 to a user by wrapping around a user's arm or wrist. The strap 150 can include an attachment feature 152 that can correspond to an engagement or attachment feature 108 defined by the housing 102 of the device 100. For example, the attachment feature 152 can include one or more magnetic components that can magnetically engage or be attracted to magnetic material located near the attachment feature 108 of the housing 102.

In some examples, the securement component 150 can further include other components such as a metallic lug or stiffening component that can serve to physically reinforce the strap 150 at the location of the attachment feature 152. In some examples, the strap 150 can include electronic components that can aid in providing an indication to the device 100 that the strap 150 has been attached or secured thereto, such as by the engagement of the attachment feature 152 with the attachment feature 108. For example, the strap 150 can include a radio frequency identification (RFID) tag, one or more electronic circuits, or any other component that can be detected by the device 100, or that can provide a signal to the device 100, to indicate that the strap 150 has been attached thereto.

The device 100 can also include internal components, such as a battery 122, a haptic engine 124, and a system in package (SiP) 126, including one or more integrated circuits, such as processors, sensors, and memory. The SiP can also include a package. The internal components, such as one or more of components 122, 124, 126, can be disposed within an internal volume defined at least partially by the housing 102, and can be affixed to the housing 102 via internal surfaces, attachment features, threaded connectors, studs, posts, or other features, that are formed into, defined by, or otherwise part of the housing 102 and/or the cover 116 or back cover 130. Further, in some examples, magnetic material and/or one or more magnetic components can be disposed in the internal volume, for example, to interact with or to retain one or more accessories including magnetic components, as described herein.

The wearable device 100 can also include a magnetometer 160 disposed in the internal volume defined by the housing 102, the cover 116, and the back cover 130. In some examples, this magnetometer 160 can communicate with one or more other components of the wearable device 100, such as processors, memory, or other components and can provide data and/or signals to these components, for example, to provide magnetic field information thereto. In some examples, the magnetometer 160 can include a digital compass system that can detect an orientation and magnitude of the Earth's magnetic field in three-dimensional space. In some examples, the magnetometer 160 can include a digital magnetometer. In some examples, the magnetometer 160 can include a three-axis magnetometer, that is, a magnetometer capable of detecting a magnetic field strength and orientation in three dimensions. In some examples, the magnetometer 160 can include a microelectromechanical (MEMS) magnetometer, although the magnetometer 160 can include any desired form of magnetometer. In some examples, the magnetometer 160 can be or can include a tilt-compensated magnetometer, that is, a magnetometer package including an accelerometer to detect and/or provide an estimation of the direction of gravity. In some examples, a digital compass system including the magnetometer 160 can include or can utilize a global positioning system or global positioning data to provide an estimation or calculation of true north. For example, the device 100 can determine or calculate true north by adding the declination as determined, at least partially, based on the global positioning system to the magnetic north direction, as determined by the compass system and/or magnetometer 160.

The magnetometer 160 can be disposed at a location in the internal volume that is substantially adjacent to, or near, a periphery of the internal volume. That is, in some examples, the magnetometer 160 can be disposed substantially adjacent to, or near, an internal surface of a component, such as the housing 102, that defines the internal volume of the device 100. In some examples, the magnetometer 160 can be selectively disposed far from one or more hard or soft magnetic components of the device 100. For example, the magnetometer 160 can be disposed at a location in the internal volume that is intentionally not above or below hard magnetic components, such as a hard magnetic material disposed in the back cover 130. The location of the magnetometer 160 in the internal volume can be chosen so as to reduce hard and soft magnetic distortions experienced by the magnetometer 160 that are caused by the other components of the device 100.

Figure 3:
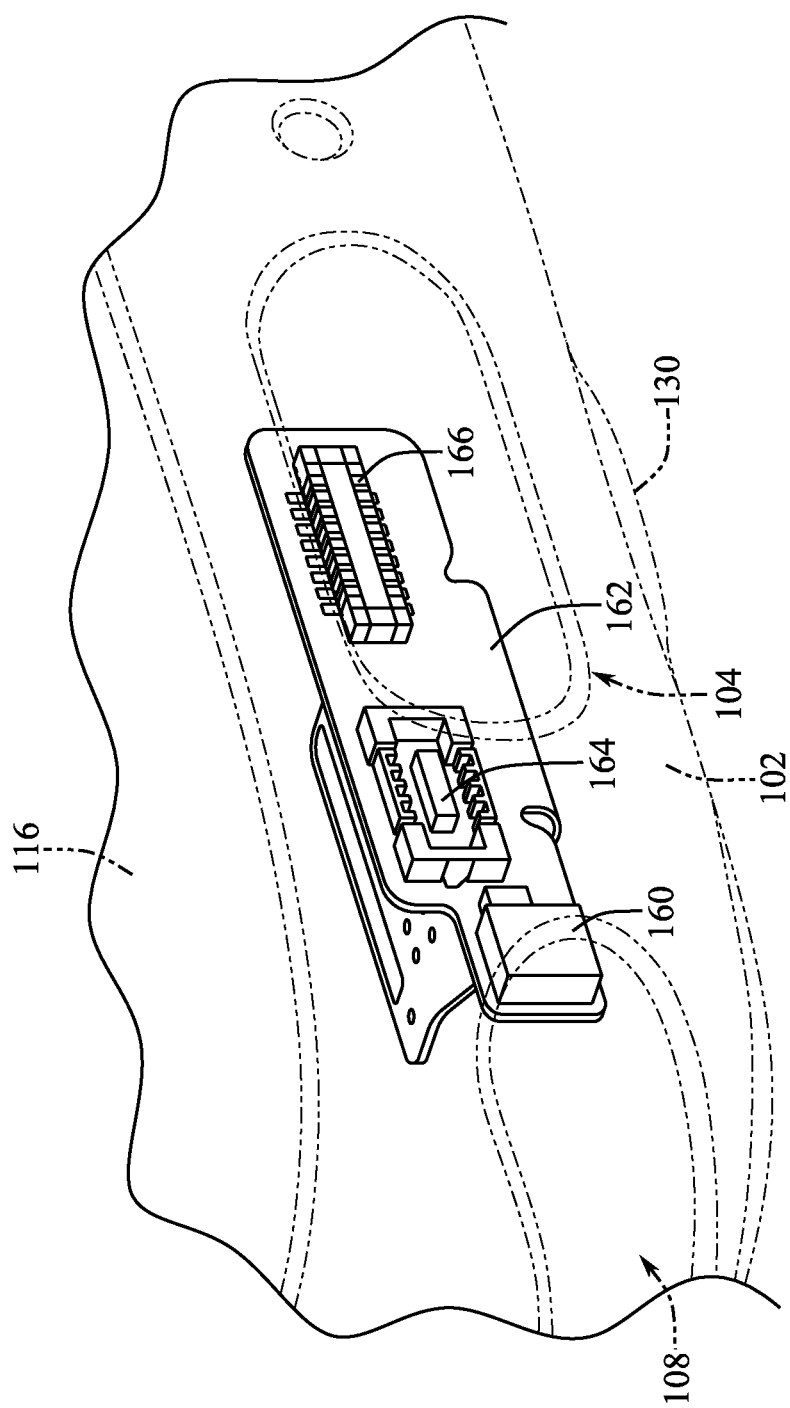
FIG. 3 shows a close-up view of a component of the electronic device of FIG. 1.

FIG. 3 illustrates a view of the magnetometer 160 and its position in the internal volume at least partially defined by the housing 102. As can be seen, the position of the magnetometer 160 can be near or adjacent to the attachment feature 108 defined by the housing 102. The soft magnetic distortion induced by a component, such as a strap or a band, can change if the strap 150 is removed, and/or if a different strap or another component is attached to the device 100 at the attachment feature 108. The close proximity of the magnetometer 160 to the attachment feature 108 can result in the soft magnetic distortions from a removably attachable component 150 at the attachment feature 108 having a large influence on the magnitude and/or direction of the magnetic field detected by the magnetometer 160. In some examples, however, this potentially variable soft magnetic distortion can be compensated for by the methods and components described herein.

In some examples, the magnetometer 160 can be held in a desired location by a bracket or a brace 162. The bracket 162 can be affixed to other components of the device 100 by features such as studs, posts, screws, or any other feature for attachment or securement. In some examples, one or more additional electronic components or sensors can also be affixed to the bracket 162. For example, components 164 and 166 can be affixed to the bracket 162 near the magnetometer 160. In some examples, these components can serve to relay signals provided by the magnetometer 160 to other components of the device 100. In some examples, these components 164, 166 can be part of a digital compass circuit or system, and can aid or assist in converting the raw data collected by the magnetometer 160 to a form that can be used by one or more other components, systems, or processes of the device 100.

Any number or variety of electronic devices can include a magnetometer, as described herein. Processes for calibrating the magnetometer and compensating for hard and soft magnetic distortions experienced by the magnetometer can include detecting a change in the magnetic distortions experienced by the magnetometer, collecting data with the magnetometer, and generating a calibration model by any methods known or discovered in the future. The electronic device can also include any form of distortion shielding that can shield that magnetometer from hard and/or soft magnetic distortions, or that can normalize or compensate for hard and/or soft magnetic distortions experienced by the device, for example, due to attachment of a component thereto. The calibration and compensation processes, as well as the shielding components, described herein can be used in any device in any combination. Various examples of electronic devices including magnetometers and removable attachable components, as well as methods and components for compensating for hard and soft magnetic distortions, are described below with reference to FIGS. 4A-6.

Figure 4B:
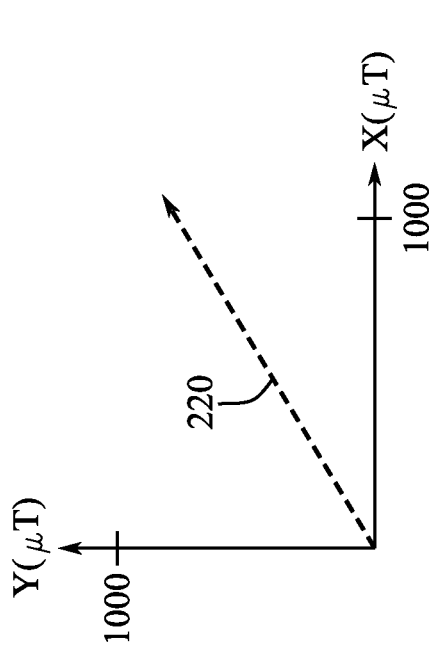
FIGS. 4A-4D show plots of magnetic field strength vectors in two dimensions.
Figure 4D:
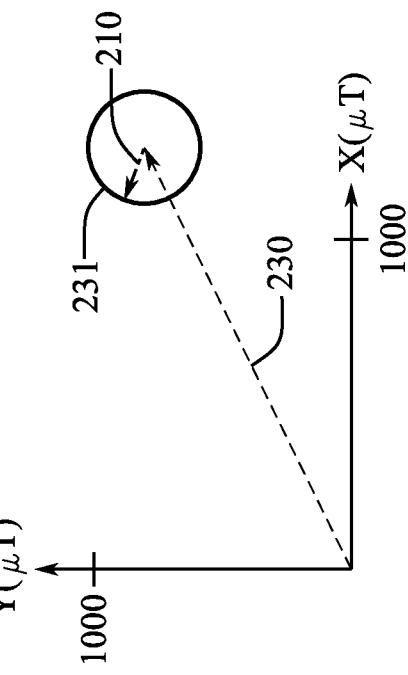
Figure 4A:
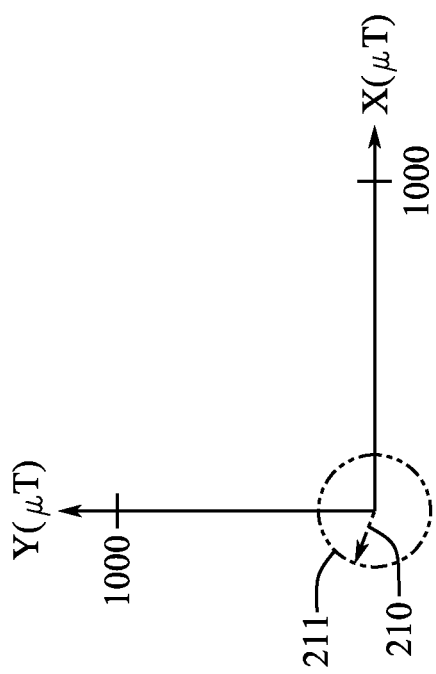

FIG. 4A shows a two-dimensional measurement space for magnetic field vectors detected by a magnetometer, as described herein. It should be understand that the two-dimensional space, for example, including an X-axis having units of microTesla ($\mu$T) and a Y-axis also have units of $\mu$T, is used herein for illustrative purposes, and that the magnetic field vectors measured or detected by a magnetometer, as described herein, can be three-dimensional magnetic field vectors in a three-dimensional measurement space having X, Y, and Z axes. The vector 210 shown in FIG. 4A is the magnetic field vector of Earth's magnetic field, as would be detected by a magnetometer in a given orientation with no hard or soft magnetic distortions present. As can be seen, the vector 210 extends a distance or radius from the origin of the measurement space. When the magnetometer is rotated throughout space, the vector 210 will rotate about the origin to define the circle 211 representing Earth's magnetic field.

Figure 4C:
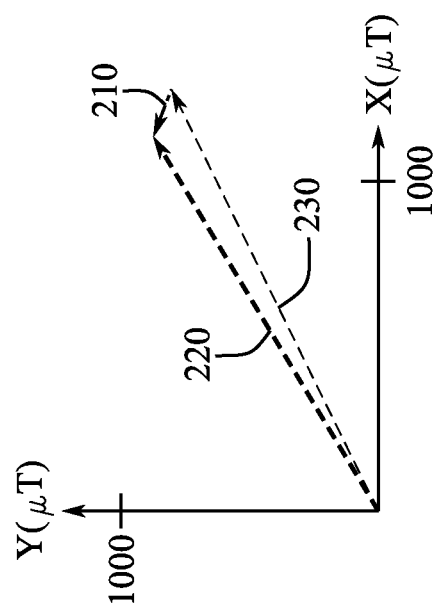

When magnetic distortions are present, as shown in FIG. 4B, a magnetometer in a given orientation will output a measurement vector 220 that is a combination of Earth's magnetic field vector and any hard or soft magnetic distortions experienced by the magnetometer. FIG. 4C illustrates how the measurement vector 220, that is the magnetic field vector detected by the magnetometer, is a vector sum of the Earth's magnetic field vector 210 and an error vector 230. This error vector 230 can represent the hard magnetic distortions experienced by the magnetometer from hard magnetic materials or components that are fixed to the device. Accordingly, if the error vector 230 of the device can be determined, for example, by a calibration process, then the error vector 230 can be subtracted from the measurement vector 220 and the direction and magnitude of Earth's magnetic field vector 210 can be calculated. In some examples, a calibration process can include any of the calibration processes described herein. In some examples, a calibration process can be performed during or subsequent to assembly of the device, for example, in a factory. In some examples, the calibration process can be performed at any time, for example, upon detection of a condition by the device, or upon being prompted by a user to do so.

FIG. 4D illustrates the calculated Earth's magnetic field vector 210, now positioned at the end of the error vector 230, and the circle 231 representing Earth's magnetic field in all orientations. The vector 210 can be calculated from the measurement vector 220 of the magnetometer based at least partially on a calibration model or process. Accordingly, subsequent measurements by the magnetometer in a variety of orientations can be used to calculate the circle 231 representing the values of Earth's magnetic field in all device orientations. This calculated circle 231 in the measurement space can be used, along with the measurement vector 220, to quickly determine the orientation of a device including the magnetometer by comparing the measurement vector 220 to the calculated field 231 to determine an orientation of the magnetometer with respect to the Earth's magnetic field 231. Further details regarding calibrating and compensating for distortions experienced by a magnetometer are described below with reference to FIG. 5.

Figure 5:
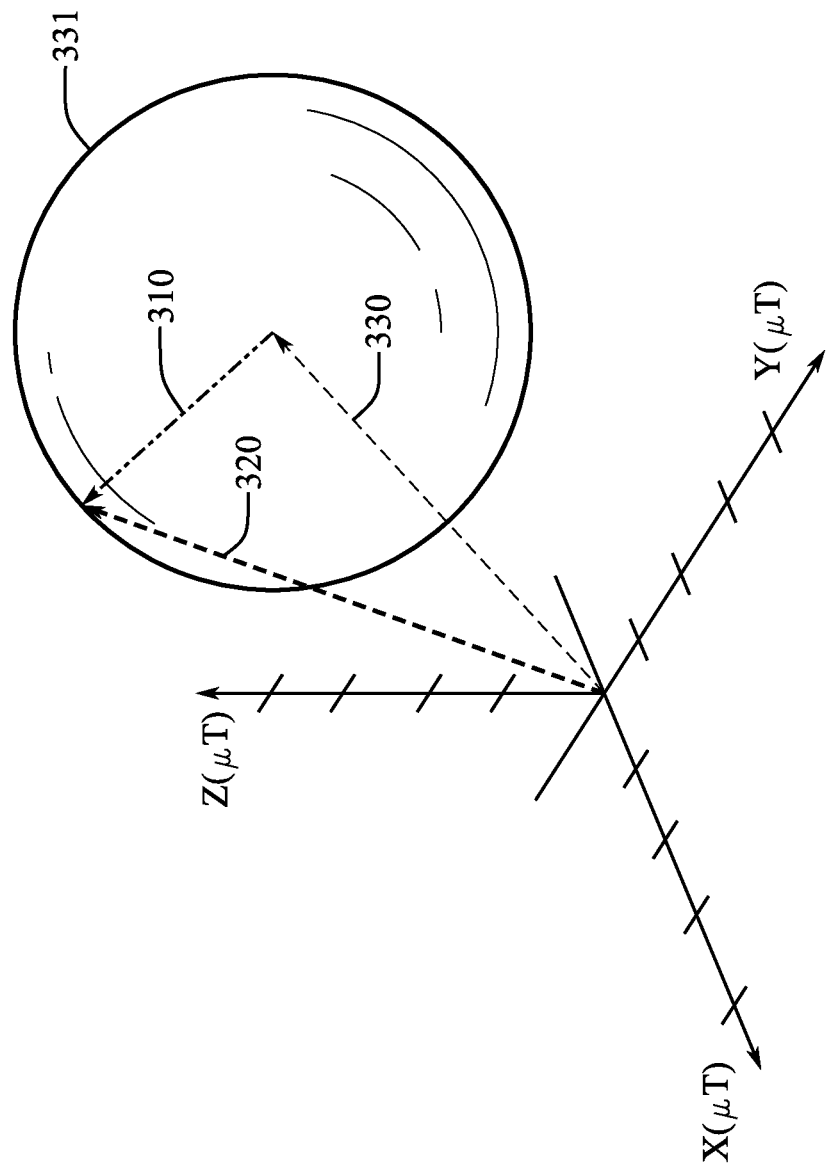
FIG. 5 shows a plot of magnetic field strength vectors in three dimensions.

FIG. 5 illustrates the application of the concepts and principles described herein with respect to the two-dimensional measurement space of FIGS. 4A-4D to a three-axis measurement space including an X-axis, Y-axis, and Z-axis, also referred to as an inertial reference frame. This measurement space can be associated with a three-axis magnetometer, as described herein. Each axis of the measurement space can represent the strength of a magnetic field vector along that direction in an inertial reference frame, as measured by the magnetometer, in Tesla (T) or microtesla (µT). As can be seen, the three-axis magnetometer can output or detect a measurement vector 320 that can have a magnitude and an orientation in the three-dimensional measurement space. Similar to the measurement vector 220 described with respect to FIGS. 4A-4D, the measurement vector 320 can be a vector sum of the Earth's magnetic field vector 310 and an error vector 330 that represents the hard magnetic distortions experienced by the magnetometer.

Accordingly, if the error vector 330 can be determined or calculated, for example, through one or more calibration processes, then it can be subtracted from the measurement vector 320, and the vector 310 of the Earth's magnetic field can be determined from the measurement vector 320. Further collection of data by the magnetometer in a variety of orientations, such as during a calibration process, can then allow for the calculation of a sphere 331 representing the Earth's magnetic field in all orientations. The sphere 331 can have its center disposed at the end point of the error vector 330. Accordingly, an orientation of the magnetometer and/or a device including the magnetometer can be easily determined by assessing where the measurement vector 320 is located on the sphere 331 and using the resultant vector 310 of Earth's magnetic field to calculate the orientation of the magnetometer with respect to Earth's magnetic field. Further details processes and methods for compensating for the distortions experienced by a magnetometer are described below with reference to FIG. 6.

Figure 6:
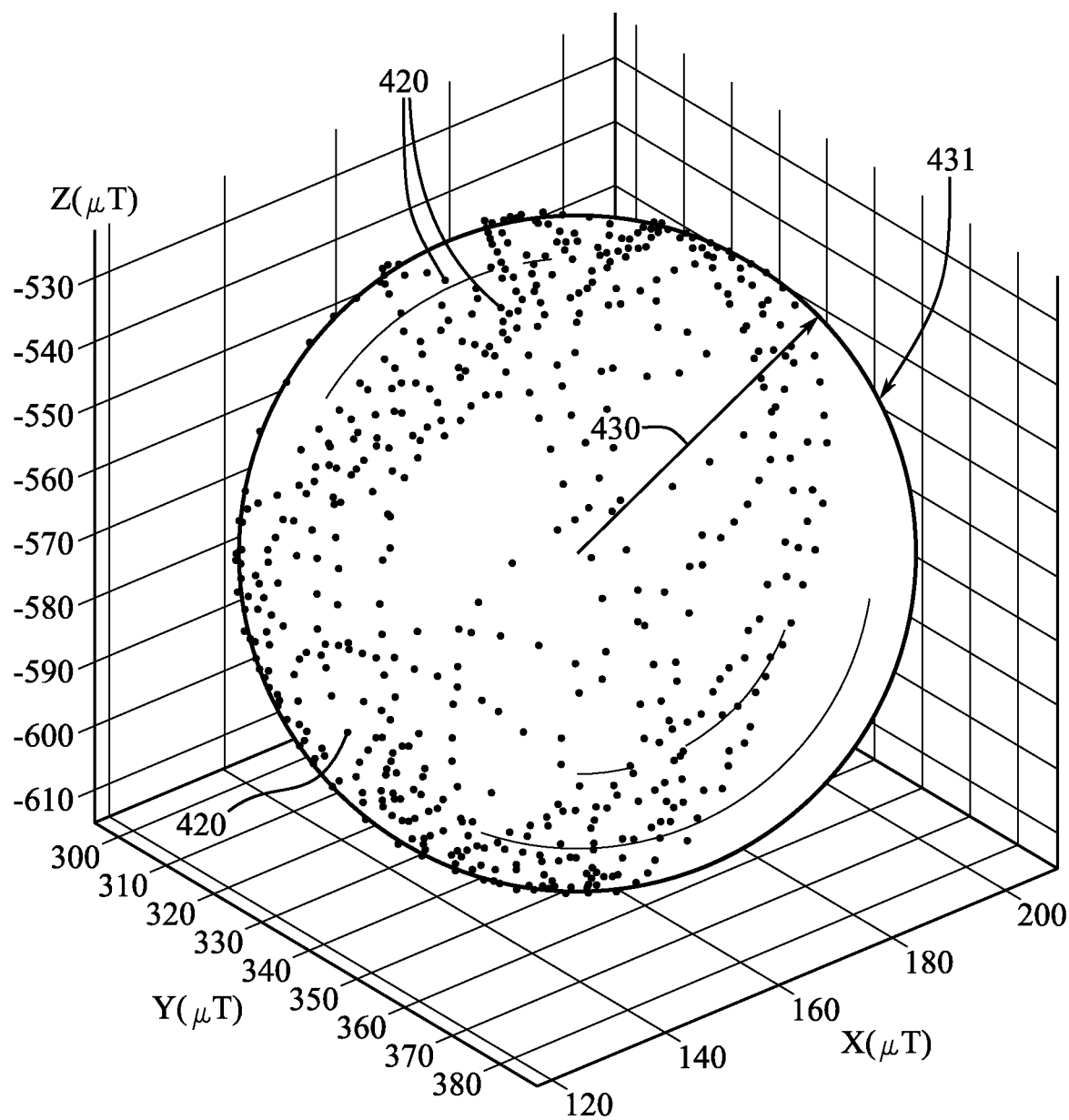
FIG. 6 shows a plot of collected magnetometer data in three dimensions.
Figure 7:
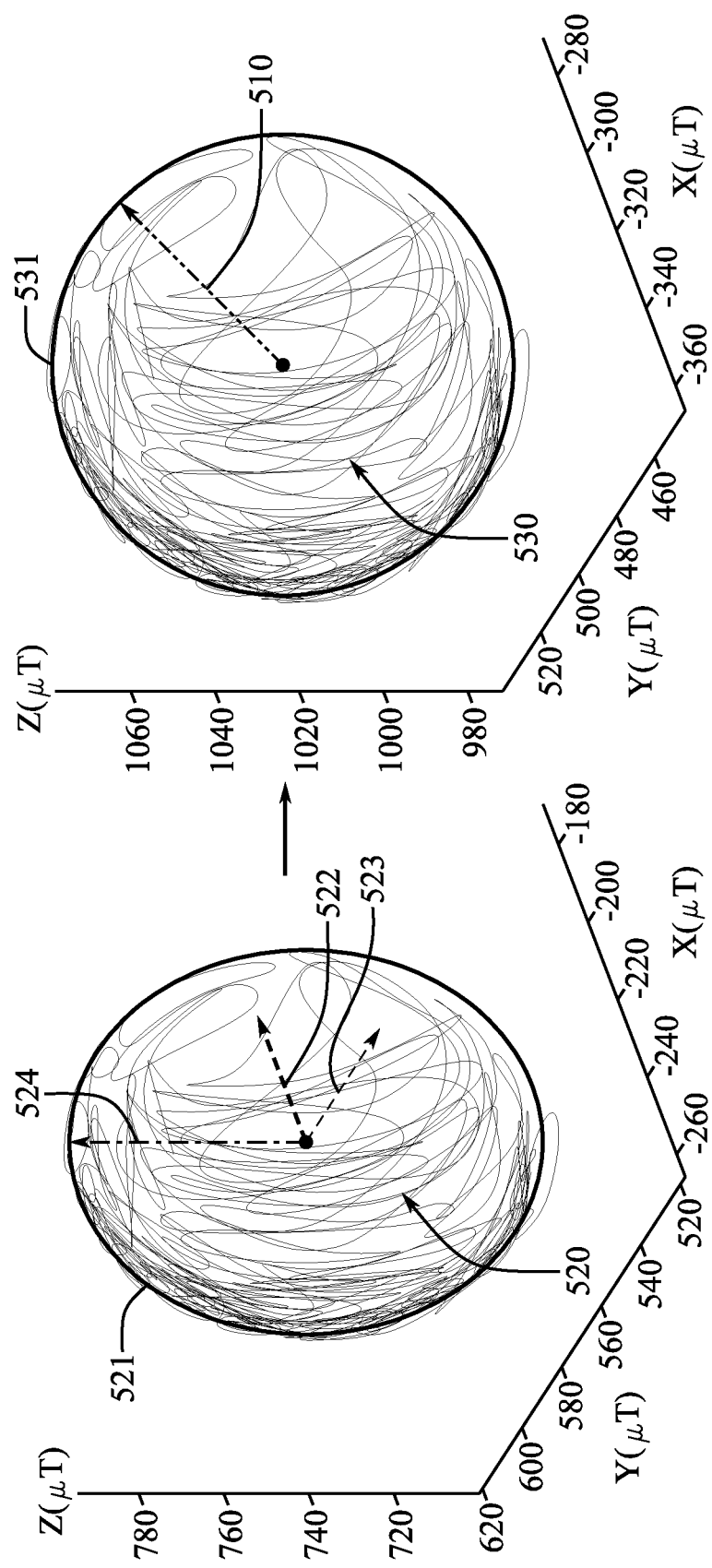
FIG. 7A shows a plot of collected magnetometer data in three dimensions.
FIG. 7B shows a plot of the collected magnetometer data of FIG. 7A after being mapped by an algorithm.

FIG. 6 illustrates a three-dimensional measurement space associated with a magnetometer including X, Y, and Z axes measured in µT, similar to the measurement space described with respect to FIG. 5. As can be seen, the magnetometer can detect and record the magnetic field experienced by the magnetometer, and can subsequently plot this field vector as data points 420 in the measurement space. The magnetometer can be moved in a variety of orientations and positions with respect to Earth's magnetic field, and the magnetic field data points 420 produced during this movement can be plotted in the measurement space, as shown. As can be seen, after collecting a desired number of data points 420, a sphere 431 representing the Earth's magnetic field can be generated, calculated, or fit to the data points 420. This sphere 431 can have its center located at a position in the measurement space corresponding to the error vector, as described with respect to FIG. 5. Accordingly, once the sphere 431 representing the Earth's magnetic field has been generated, a measurement vector of the magnetometer can be compared to the sphere, and the Earth's magnetic field vector 430 can be derived. Once the Earth's magnetic field vector 430 is known, the orientation of the magnetometer, and/or a device containing the magnetometer, can be determined, as described herein.

In some examples, the processes for generating a sphere or other shape in a measurement space based on collected magnetometer data, as described with respect to FIG. 6, can be part of a calibration process of a three-axis magnetometer that can account for or otherwise compensate for hard magnetic distortions experienced by the magnetometer from hard magnetic materials or components fixed relative to the device, and that can allow for substantially accurate measurements of the Earth's magnetic field, for example, to provide a digital compass functionality to an electronic device containing the three-axis magnetometer.

Any number or variety of electronic devices can include a magnetometer, as described herein. Processes for calibrating the magnetometer and compensating for hard and soft magnetic distortions experienced by the magnetometer can include detecting a change in the magnetic distortions experienced by the magnetometer, collecting data with the magnetometer, and generating a calibration model by any methods known or discovered in the future. The electronic device can also include any form of distortion shielding that can shield that magnetometer from hard and/or soft magnetic distortions, or that can normalize or compensate for hard and/or soft magnetic distortions experienced by the device, for example, due to attachment of a component thereto. The calibration and compensation processes and shielding components described herein can be used in any device in any combination. Various examples of electronic devices including magnetometers and removable attachable components, as well as methods and components for compensating for hard and soft magnetic distortions, are described below with reference to FIGS. 7A-7B.

While the above described concepts and processes can be used to calibrate a magnetometer and compensate for hard magnetic distortions experienced by the magnetometer, a device including the magnetometer can also contain one or more soft magnetic components or materials that can further distort the magnetometer's measurements of Earth's magnetic field. As described herein, soft magnetic components, or components containing soft magnetic materials, can draw or attract magnetic flux toward or through the soft magnetic materials, thereby distorting the direction of magnetic fields near the soft magnetic materials. For example, when a soft magnetic material is disposed near a magnetometer, the flux of the Earth's magnetic field can be drawn towards or be otherwise distorted by the soft magnetic material in the vicinity of the magnetometer, and the field measured by the magnetometer will not be an accurate representation of the Earth's magnetic field at that location. Further, when a magnetometer and a soft magnetic component of a device are moved to a different orientation, the soft magnetic component will be in a different position relative to the magnetometer and the Earth's magnetic field, and will cause a different distortion of the magnetic field measured by the magnetometer.

Accordingly, whereas a magnetometer typically experiences the same hard magnetic distortions in all orientations, soft magnetic distortions experienced or detected by a magnetometer can depend on the magnetometer's orientation relative to the Earth's magnetic field. Thus, when a magnetometer in the presence of soft magnetic distortions collects data in a variety of orientations, the data points collected typically fall on or define an ellipsoid, rather than falling on or defining a sphere, as described with respect to FIG. 6.

This situation is illustrated in FIG. 7A, which shows data 520 collected by a magnetometer as the magnetometer is moved about a variety of orientations in three dimensional space. The data 520, here represented by a line a three-dimensional measurement space, falls on or defines an ellipsoid 521 that can represent Earth's magnetic field as experienced by the magnetometer and as distorted by soft magnetic components of, or near, the device. Similar to the sphere 431 of FIG. 6, the center of the ellipsoid 521 can represent an error vector associated with hard magnetic distortions. Accordingly, the calibration or compensation processes described herein with respect to hard magnetic distortions, such as in relations to FIGS. 4A-6 can be used in combination with the processes described with respect to soft magnetic distortions, such as in relation to FIG. 7B.

If the parameters defining the ellipsoid 521 are known or can be determined, then a function mapping or fitting the ellipsoid 521 to a sphere 531, as shown in FIG. 7B, can be calculated, generated, or determined. This function or algorithm can be known as an elliptical calibration model and can be used to compensate for soft magnetic distortions experienced by the magnetometer. The ellipsoid 521 shown in FIG. 7A can be defined by nine parameters, that is, it can be defined by a center having X, Y, and Z coordinates in the measurement space, a first radius 522, a second radius 523, and a third radius 524, each radius having a single magnitude value, and an orientation of the ellipsoid 521 defined by three angles relative to the axes of the measurement space. In some examples, an elliptical calibration model can map, fit, or transform the ellipsoid 521, and the data 520 used to calculate it, to the sphere 531 and data 530 shown in FIG. 7B defined by four parameters: a center having X, Y, and Z coordinates, and a radius 510 representing the Earth's magnetic field vector. The data 530 modified or transformed by the elliptical calibration model can be used to determine the orientation of the magnetometer in three-dimensional space with respect to the Earth's magnetic field, for example, as described in FIGS. 4A-6.

In some examples, an elliptical calibration model can be generated by moving the magnetometer, or the device including the magnetometer, in a variety of orientations in three-dimensional space and collecting the associated magnetic field data, for example, the data 520 illustrated in FIG. 7B. In some examples, moving the magnetometer or device can include moving the magnetometer or device about one or more axes and collecting the magnetic field data. In some examples, the magnetometer can collect data points at a sampling frequency of at least one Hertz (Hz). In some examples, the magnetometer can collect data points at a frequency of up to 100 Hz, 200 Hz, or even higher. In some examples, the magnetometer can collect data at a frequency of between 10 Hz and 20 Hz. In some examples, the magnetometer can collect this data for a time of at least one minute. In some examples, the magnetometer can collect this data for at least one minute, at least two minutes, at least five minutes, at least 10 minutes, at least 15 minutes, at least 20 minutes, at least 30 minutes, an even longer duration, or even continuously while the device is operating. In some examples, the data can be collected in a single continuous duration. In some examples, however, the data collection time period can be split over any number of discrete and separate durations that can add up to the desired duration.

Once a desired amount of data has been collected, an elliptical calibration model mapping the data, for example, data 520 that can define an ellipsoid 521, to a sphere 531 can be generated. In some examples, the desired amount of data can be determined by calculating a fit cost of the collected data 520, as compared to an ellipsoid 521 calculated or generated based on the data 520. In some examples, the desired amount of data 520 can be determined, at least partially, by determining a percentage of the surface area of an ellipsoid 521 or sphere 531 that is covered by the data 520 or 530. In some examples, the desired amount of data 520 can be determined based solely on a duration of a data collection time. In some examples, the desired amount of data 520 can be determined by detecting whether the data 520 has been collected along a desired amount of axes or in a desired amount of dimensions, such as in all three dimensions of the measurement space. In some examples, the desired amount of data 520 can be determined based on a calculated planarity value of the data 520. In some examples, a desired amount of data 520 can be determined based on combinations of two or more of the above described processes.

While the calibration of a device including a magnetometer and soft magnetic materials can be performed by the device's manufacturer subsequent to assembly, issues can arise when the amount or position of soft magnetic materials adjacent to the device changes after initial calibration. For example, as shown in FIG. 2, a wearable device can include a removably attachable band 150 that can include a soft magnetic material, such as a lug of the band 150. A user might desire to have more than one type of band for the device 100, and could remove a first band 150 that produces a first soft magnetic distortion from the device 100 and attach a second, different band (not shown) to the device 100 that can produce a second, different soft magnetic distortion. The previously generated electrical calibration model that accounts for the soft magnetic distortions from the first band 150 will no longer be accurate for the second band, and determinations of the Earth's magnetic field will no longer be as accurate as desired because the soft magnetic distortion experienced by the magnetometer has changed. As a result, in some examples, data can be collected by the magnetometer subsequent to the change in the component and a new elliptical calibration model can be generated in response to the change in soft magnetic distortion experienced by the magnetometer.

Any number or variety of electronic devices can include a magnetometer, as described herein. Processes for calibrating the magnetometer and compensating for hard and soft magnetic distortions experienced by the magnetometer can include detecting a change in the magnetic distortions experienced by the magnetometer, collecting data with the magnetometer, and generating a calibration model by any methods known or discovered in the future. The electronic device can also include any form of distortion shielding that can shield that magnetometer from hard and/or soft magnetic distortions or that can normalize or compensate for hard and/or soft magnetic distortions experienced by the device, for example, due to attachment of a component thereto. The calibration and compensation processes and shielding components described herein can be used in any device in any combination. Various examples of electronic devices including magnetometers and removable attachable components, as well as methods and components for compensating for hard and soft magnetic distortions are described below with reference to FIGS. 8-9.

Figure 8:
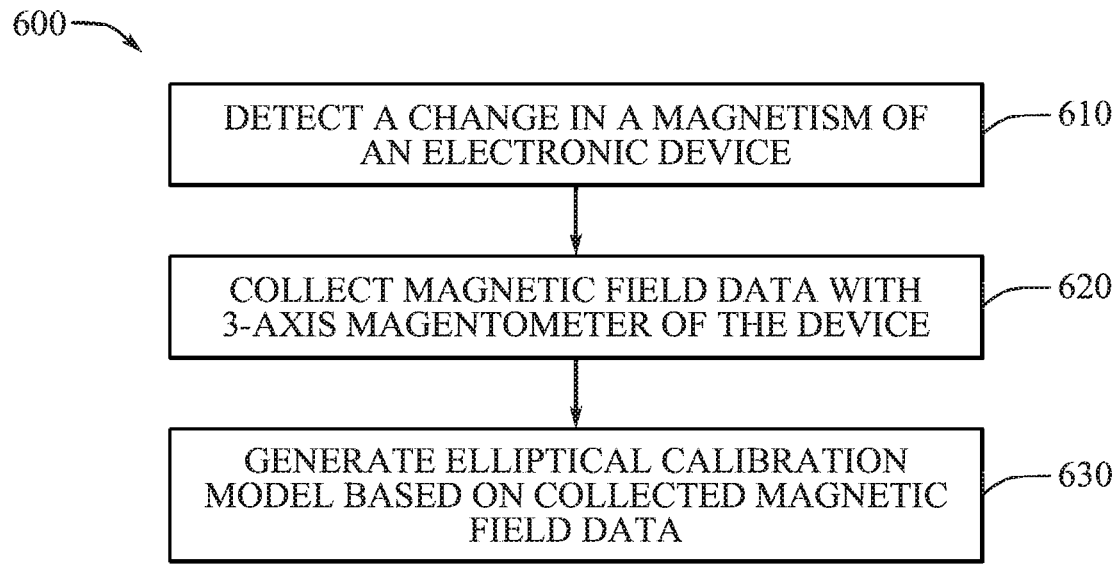
FIG. 8 shows a process flow diagram for a method of calibrating a magnetometer of an electronic device.

FIG. 8 illustrates a process flow diagram for a method 600 of calibrating a magnetometer of a device, for example, device 100. The method 600 can include detecting a change in a magnetism of the device 610, collecting magnetic field data with a three-axis magnetometer of the device 620, and generating an elliptical calibration model 630 based at least partially on the collected magnetic field data.

Initially, a change in the magnetism of the electronic device can be detected 610. In some examples, the change in the magnetism of the device can be a change in the hard magnetism of the device, for example, a change in the hard magnetic distortion experienced by the magnetometer due to one or more components of the device. In some examples, a change in magnetism of the device can be a change in the soft magnetism of the device. More specifically, a change in magnetism can be a change in the soft magnetic distortion experienced by the magnetometer due to one or more components of the device. In some examples, the change in magnetism can be a change in both the hard magnetism and the soft magnetism due to one or more components associated with the device, and the distortions experienced by the magnetometer.

In some examples, the device can detect the change in magnetism automatically, that is, without requiring an input from a user of the device. For example, the device can detect a change in a component or a change in a state of a component, such as a band or other removably attachable component of the device, and can detect a change in the magnetism associated with the change in the component. In some examples, detecting the change in the component can include detecting when a first component has been removed from the device. In some examples, detecting the change in the component can include detecting when a component has been attached to the device, such as when a second, different component has been attached to the device after a first component has been removed therefrom.

In some examples, the device can detect the change in the component by detecting a change in the magnetic distortion associated with the component, such as through the magnetometer. In some examples, the device can detect the change in the component through one or more sensors that can be configured to detect whether a component is attached to the device. For example, a proximity sensor can detect when a component is near to, adjacent to, and/or attached to the device. In some examples, a removably attachable component can provide a signal to the device indicating that is has been attached thereto, and the device can detect the change in magnetism based at least partially on this indication. For example, a band can include a contact portion that can come into electrical contact with one or more components of the device when the band is attached to the device, thereby providing an indication to the device and allowing for detection of the change in magnetism associated with the component. In some examples, the component can wirelessly, or otherwise without contact, provide a signal to the device indicating proximity or attachment of the component. For example, a removably attachable component can include an RFID tag that can provide a radio frequency signal to the device indicating that the component has been attached thereto.

In some examples, detecting the change in magnetism can include prompting a user and receiving an input or response from the user based on the prompt indicating that a change in components and/or magnetism of the device has occurred. For example, the device can prompt the user through a user interface to indicate whether there has been a change in a component of the device, such as the band. In some examples, the user can indicate that a magnetism and/or a component of the device has changed without a prompt, such as by navigating to a menu of the device, thereby allowing the device to detect the change in magnetism associated with the change in component through the user's input.

In some examples, detecting the change in magnetism can include detecting one or more changes in the ambient environment or in the environment of the device. For example, detecting the change in magnetism can include detecting a change in a temperature of the environment or the device. In some examples, the detected change in temperature can be above a threshold that can produce a predetermined change in a level of magnetic distortion of the device. For example, the device can detect when the temperature has risen above a threshold that can result in a predetermined amount of change in a magnetism of the device, and thus, a change in the magnetic distortion experienced by the magnetometer.

In some examples, detecting the change in the magnetism of the device can include detecting a change in an internal hard and/or soft magnetic state of the device. In some examples, detecting the change in the magnetism of the device can include detecting an exposure of the device to an external magnetic field that could shift the internal magnetic state of the device, for example by at least partially or temporarily magnetizing one or more components of the device.

When a change in magnetism has been detected, magnetic field data can be collected by a three-axis magnetometer of the device 620. As described herein, the magnetometer can collect magnetic field data at a sampling frequency of at least about one Hz, at least about 10 Hz, at least about 20 Hz, or even about 100 Hz, or more. In some examples, collecting the data can include collecting the data for a time period of at least about one minute, at least about 2 minutes, at least about 5 minutes, at least about 15 minutes, or at least about 30 minutes, or even longer, as described herein.

In some examples, collecting the data can include prompting the user to perform a data collection procedure and/or receiving an input or response from the user that instructs the magnetometer to start collection. In some examples, such as when collecting the data includes prompting the user to perform a data collection procedure, data can be collected until the user has performed a desired amount of the data collection procedure. For example, a data collection procedure can include the user rotating the device a desired amount about one or more desired spatial axes, and data can be collected until the device or a component thereof has detected that the data collection procedure has been completed.

In some examples, collecting magnetic field data can be initiated based at least partially on detecting the change in the magnetism of the electronic device at block 610. In some examples, the device can continually or substantially continually collect magnetic field data while the device is operating. In some examples, collecting the magnetic field data can include collecting the magnetic field data in the background. That is, magnetic field data collection can occur without the device indicating to the user that such a process is occurring or running thereon. For example, the device can collect magnetic field data while performing one or more other functions or processes, or even while in a sleep or a rest mode.

The magnetic field data collected by the magnetometer can be used to generate an elliptical calibration model 630. Thus, the elliptical calibration model 630 can be based at least partially on the collected magnetic field data 620. In some examples, the elliptical calibration model can be generated based on the collected magnetic field data 620, in addition to magnetic field data collected at prior times and/or other calibration data. In some examples, generating the elliptical calibration model can include any one of the processes or steps discussed with respect to the elliptical calibration models of FIGS. 7A and 7B. That is, an elliptical calibration model can be a function or algorithm that maps or approximates an ellipsoid and/or one or more data points on the ellipsoid to a sphere and/or a corresponding point or points on the sphere, as described herein. The generated elliptical calibration model 630 can then be used to compensate for soft magnetic distortions experienced by the magnetometer of the device, and can provide for an accurate determination of the device's orientation relative to the Earth's magnetic field based on a second set of magnetic field data that is passed through the elliptical calibration model. Further details of methods for calibrating a magnetometer of an electronic device are described below with reference to FIG. 9.

Figure 9:
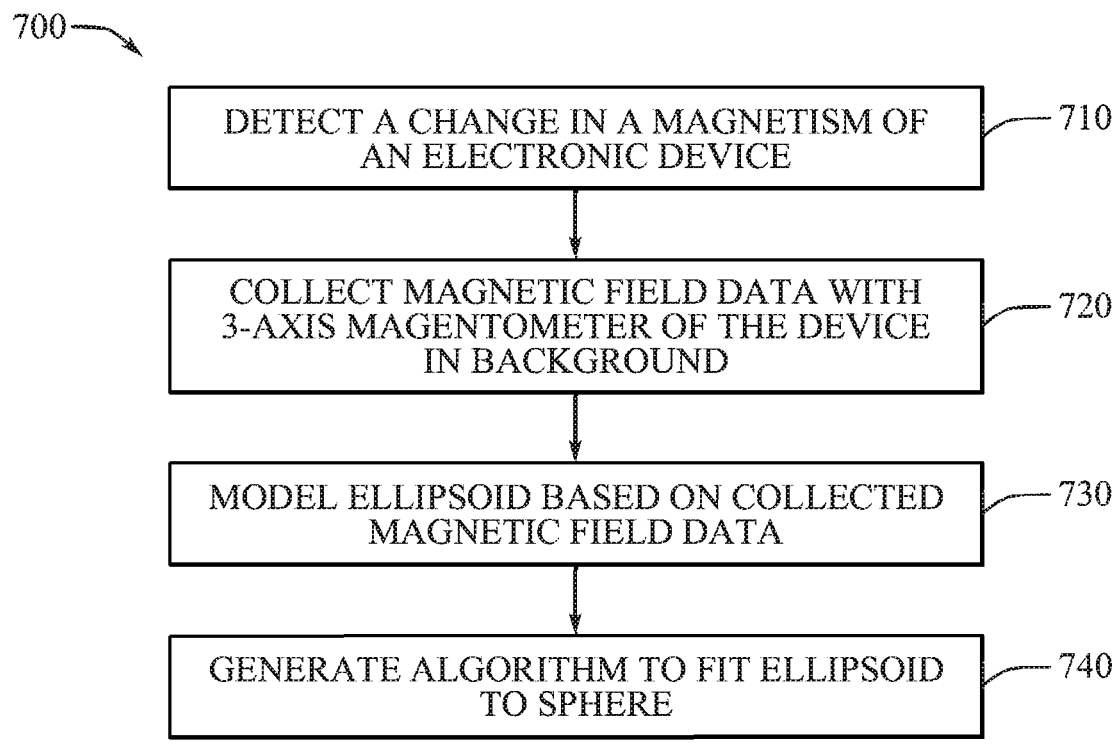
FIG. 9 shows a process flow diagram for a method of calibrating a magnetometer of an electronic device.

FIG. 9 illustrates a process flow diagram for a method 700 of calibrating a magnetometer of a wearable device, for example, a wearable device substantially similar to, and including some or all of the features of the wearable devices described herein, such as device 100. The method 700 can include detecting a change in a magnetism of the device 710, collecting magnetic field data with a three-axis magnetometer of the device in the background 720, modelling an ellipsoid based on the collected magnetic field data 730, and generating an algorithm, such as an elliptical calibration model 740, to fit the ellipsoid to a sphere.

A change in the magnetism of the electronic device can be detected 710 in any number of ways. In some examples, the change in the magnetism of the device can be a change in the hard magnetism of the device, for example, a change in the hard magnetic distortion experienced by the magnetometer due to one or more components of the device. In some examples, a change in magnetism of the device can be a change in the soft magnetism of the device, that is a change in the soft magnetic distortion experienced by the magnetometer due to one or more components of the device. In some examples, the change in magnetism can be a change in both the hard magnetism and the soft magnetism due to one or more components of, or adjacent to, the device, and the distortions associated therewith experienced by the magnetometer.

In some examples, the device can detect the change in magnetism automatically, that is, without requiring an input from a user of the device. For example, the device can detect a change in a component or a change in a state of a component, such as a band or other removably attachable component of the device, and can detect a change in the magnetism associated with the change in the component. In some examples, detecting the change in the component can include detecting when a first component has been removed from the device. In some examples, detecting the change in the component can include detecting when a component has been attached to the device, such as when a second, different component has been attached to the device after a first component has been removed therefrom.

In some examples, the device can detect the change in the component by detecting a change in the magnetic distortion associated with the component, such as through the magnetometer. In some examples, the device can detect the change in the component through one or more sensors that can be configured to detect whether a component is attached to the device. For example, a proximity sensor can detect when a component is near to, adjacent to, and/or attached to the device. In some examples, a removably attachable component can provide a signal to the device indicating that is has been attached thereto, and the device can detect the change in magnetism based, at least partially, on this indication. For example, a band can include a contact portion that can come into electrical contact with one or more components of the device when the band is attached to the device, thereby providing an indication to the device, and allowing for detection of the change in magnetism associated with the component. In some examples, the component can wirelessly, or without contact, provide a signal to the device indicating proximity or attachment. For example, a removably attachable component can include an RFID tag that can provide a radio frequency signal to the device, indicating the component has been attached thereto.

In some examples, detecting the change in magnetism can include prompting a user and receiving an input or response from the user, based on the prompt, indicating that a change in magnetism of the device has occurred. For example, the device can prompt the user through a user interface to inquire whether there has been a change in a component of the device, such as the band. In some examples, the user can indicate that a magnetism and/or a component of the device has changed without a prompt, such as by navigating to a menu of the device, thereby allowing the device to detect the change in magnetism associated with the change in component through the user's input.

In some examples, detecting the change in magnetism can include detecting one or more changes in the ambient environment, or in the environment of the device. For example, detecting the change in magnetism can include detecting a change in a temperature of the environment or the device. In some examples, the detected change in temperature can be above a threshold that can produce a predetermined change in a level of magnetic distortion of the device. For example, the device can detect when the temperature has risen above a threshold that can result in a predetermined amount of change in a magnetism of the device, and thus, a change in the magnetic distortion experienced by the magnetometer.

When a change in a magnetism has been detected, magnetic field data can be collected by a three-axis magnetometer of the device 720. As described herein, the magnetometer can collect magnetic field data at a sampling frequency of at least about one Hz, at least about 10 Hz, at least about 20 Hz, or even about 100 Hz, or more. In some examples, collecting the data can include collecting the data for a time period of at least about one minute, at least about 2 minutes, at least about 5 minutes, at least about 15 minutes, or at least about 30 minutes, or even longer, as described herein.

In some examples, collecting magnetic field data can be initiated based, at least partially, on detecting the change in the magnetism of the electronic device 710. In some examples, the device can continually or substantially continually collect magnetic field data. In some examples, collecting the magnetic field data can include collecting the magnetic field data in the background while the device is operating. That is, magnetic field data collection can occur without the device indicating to the user that such a process is occurring or running thereon. For example, the device can collect magnetic field data while performing one or more other functions or processes, or even while in a sleep or rest mode. In some examples, the device can automatically collect the magnetic field data in response to one or more events. For example, the device can detect movement or rotation by a user in the course of use, and can begin collecting data for a desired time period based on this detection.

In some examples, collecting magnetic field data can further include compensating for relative changes in the magnetism of the device during the collection process. For example, as a user moves a wearable device, a securement component including a soft magnetic material can move relative to the device or magnetometer, even when securely attached to the device. In some examples, collecting magnetic field data can include compensating for the changes in magnetism or magnetic distortion that result from the movement of the component. In some examples, compensating for such changes can include performing one or more software operations or applying one or more algorithms to the collected data. In some examples, compensating for the movement of the component relative to the magnetometer can include providing a compensating component, such as a spring or other component that can be biased against the removably attachable component to prevent or reduce relative movement.

Once magnetic field data is collected, an ellipsoid can be modelled based on the collected magnetic field data 730. In some examples, modelling the ellipsoid can include generating an ellipsoid based at least partially on the data collected 720. In some examples, the ellipsoid can be generated, as described herein with respect to FIG. 7A. For example, the modelled ellipsoid can be generated so that the data collected 720 is fit to the surface of the ellipsoid. In some examples, the ellipsoid can be defined in a three-dimensional measurement space by nine parameters, including a center having three coordinates in the space, three radii, each having a magnitude, and an orientation defined by three angles relative to the axes of the measurement space, as described herein.

An algorithm can then be generated by the device to fit or map the ellipsoid 730 to a sphere 740. In some examples, this algorithm can be used to compensate for soft magnetic distortions experienced by the magnetometer of the device, as described herein, such as with respect to FIGS. 7A and 7B. In some examples, the algorithm can be generated by one or more processors or other computing components of the device, and can be stored in one or more memory components of the device. In some examples, generating the algorithm can include generating an algorithm that can fit or map the nine parameters defining the ellipsoid 730 to the four parameters defining a sphere in the measurement space. That is, the sphere and the ellipsoid can share a center point, defined by three coordinates of the measurement space, and the six additional parameters defining the ellipsoid can be mapped to a single radius of the sphere.

In some examples the method 700 can further include applying the algorithm to data collected by the magnetometer, such as a second set of collected magnetic field data. For example, as described with respect to FIGS. 7A and 7B, data collected by the magnetometer can be fed into the algorithm and can be mapped to a spherical shape to compensate for soft magnetic distortions experienced by the magnetometer when the data was collected.

Any number or variety of electronic devices can include a magnetometer, as described herein. Processes for calibrating the magnetometer and compensating for hard and soft magnetic distortions experienced by the magnetometer can include detecting a change in the magnetic distortions experienced by the magnetometer, collecting data with the magnetometer, and generating a calibration model by any methods known or discovered in the future. The electronic device can also include any form of distortion shielding that can shield that magnetometer from hard and/or soft magnetic distortions, or that can normalize or compensate for hard and/or soft magnetic distortions experienced by the device, for example, due to attachment of a component thereto. The calibration and compensation processes and shielding components described herein can be used in any device in any combination. Various examples of electronic devices including magnetometers and removable attachable components, as well as methods and components for compensating for hard and soft magnetic distortions are described below with reference to FIGS. 10A-10C.

Figure 10A:
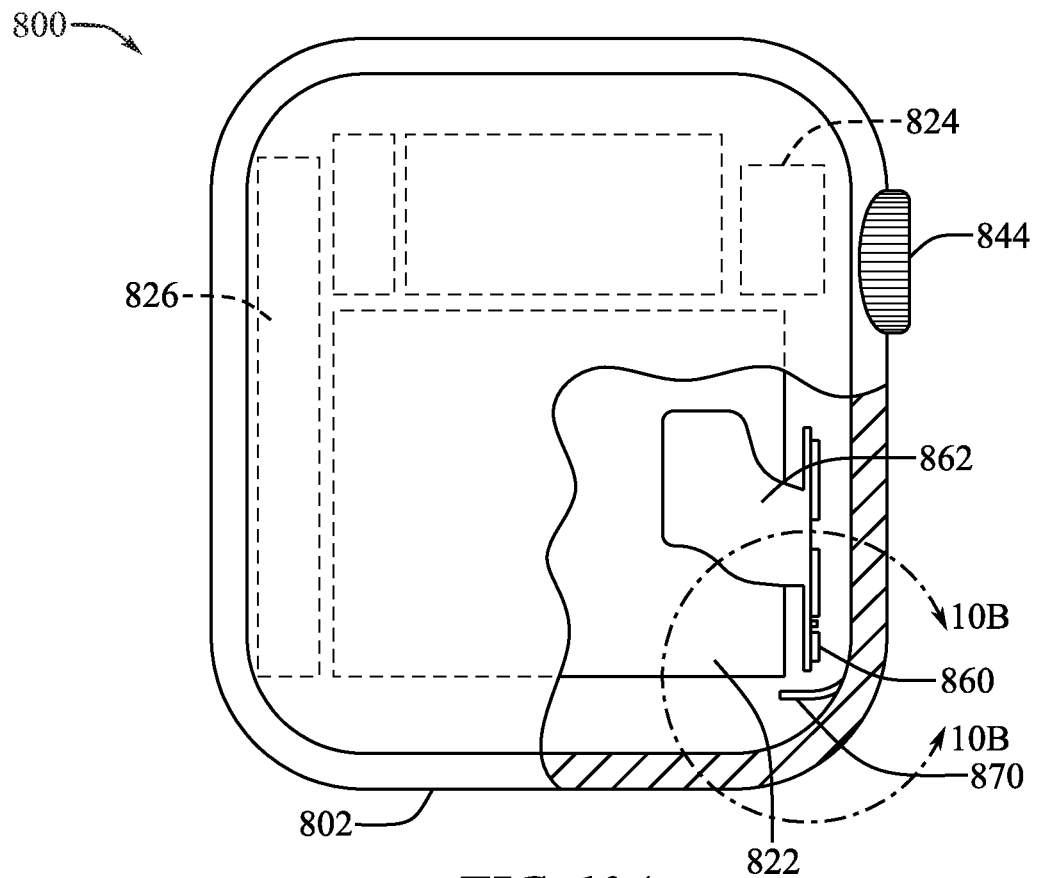
FIG. 10A shows a partial cross-sectional view of an electronic device.

FIG. 10A illustrates a cross-sectional view of an electronic device 800 that can be substantially similar to, and can include some or all of the features of the electronic devices described herein, such as wearable device 100. In some examples, the device 800 can itself be a wearable device.

The device 800 can include a housing 802 that can at least partially define an exterior surface and an interior volume of the device 800. The device 800 can also include internal components, such as a battery 822, a haptic engine 824, and a speaker 826 and external components such as a crown 844. In some examples, as described herein, one or more of the components of the device 800, such as components 822, 824, 826, 844 can include hard and/or soft magnetic materials.

Accordingly, the magnetometer 860 of the device 800 can be disposed at a location in the internal volume that is substantially adjacent or near to a periphery of the internal volume. That is, in some examples, the magnetometer 860 can be held by a bracket 862 and can be disposed substantially adjacent or near to an internal surface of the housing 802 that defines the internal volume of the device 800. In some examples, the magnetometer 860 can be disposed as far as possible or desired from one or more hard or soft magnetic components of the device 800, such as the battery 822, haptic engine 824, and speaker 826. In some examples, the magnetometer 860 can be substantially similar to, and can include some or all of the features of the magnetometers described herein, such as magnetometer 160.

In some examples, the device 800 can further include a distortion shield component 870 disposed in the internal volume and near or adjacent to the magnetometer 860. In some examples, the distortion shield component 870 can include a soft magnetic material. In some examples, the distortion shield component 870 can include a highly magnetically permeable material. For example, the distortion shield component 870 can include a material having a relative magnetic permeability of between about 10 and about 10,000, for example, of about 1000. In some examples, the distortion shield component 870 can include a polymeric material, a metallic material, a ceramic material, or combinations thereof. For example, the distortion shield component 870 can include a portion or a sheet of metallic material such as steel or iron. In some examples, the distortion shield component 870 can include a hard and/or a soft magnetic material or powder dispersed throughout or encapsulated in a polymeric material. In some examples, the distortion shield component 870 can include a polymer sheet containing a highly magnetically permeable and/or hard or soft magnetic powder or particles dispersed throughout the sheet.

Figure 10B:
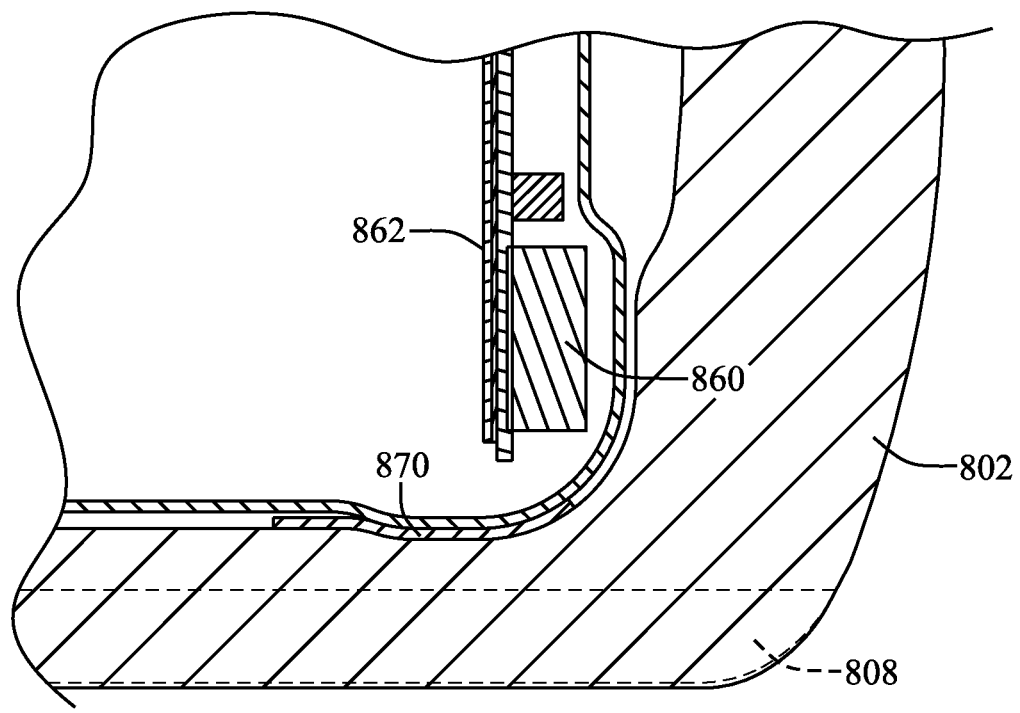
FIG. 10B shows a cross-sectional view of a portion of the electronic device of FIG. 10A.

As can be seen in FIG. 10B, in some examples, the magnetometer 860 can be disposed in the internal volume defined by the housing 802 adjacent or near to an internal surface of the housing 802 that is opposite an attachment feature 808 defined by the external surface of the housing 802. In some examples, the attachment feature 808 can be substantially similar to the attachment feature 108 described above with respect to FIGS. 1-3, and can be used to removably secure or attach a securement component for the device 800, such as a strap or a band. In some examples, the attachment feature 808 can include a hard and/or a soft magnetic material. In some examples, a removably attachable component that can be secured to the attachment feature 808 can include a hard and/or a soft magnetic material, as described herein.

In some examples, the distortion shield component 870 can be positioned in the internal volume, or within the material of the housing 802 itself, between the magnetometer 860 and the attachment feature 808. In some examples, the distortion shield component 870 can provide or introduce a desired amount of hard and/or soft magnetic distortion that can be experienced by the magnetometer 860. In some examples, magnetic distortion produced by a removably attachable component that is secured to the attachment feature 808 can have a relatively small magnitude relative to the distortion produced by the distortion shield component 870. Thus, if the removably attachment component is removed from the device or changed or swapped with another component, the change in magnetic distortion experienced by the magnetometer 860 due to this change will be relatively small relative to the total magnetic distortion experienced by the magnetometer, due at least partially to the distortion shield component 870. Accordingly, the magnetometer 860 will not require recalibration or compensation to account for this relatively small change from the component, and can still provide a desired level of accuracy, such as a desired level of accuracy for directional information.

In some examples, the distortion shield component 870 can produce levels or directions of magnetic distortion that can compensate for, offset, or normalize magnetic distortions produced by removably attachable components that can be attached to the attachment feature 808. For example, a first removably attachable component can produce a first magnetic distortion, while a second, different removably attachable component can produce a second, different magnetic distortion. The distortion shield component 870 can produce a magnetic distortion that can be combined with the first magnetic distortion or the second magnetic distortion so that the sums of these magnetic distortions are substantially similar when experienced by the magnetometer 860. Accordingly, by normalizing or compensating for the variations in distortions associated with different removably attachable components, the need to recalibrate the magnetometer when a removably attachable component is changed, added, or removed from the device can be reduced or eliminated.

Figure 10C:
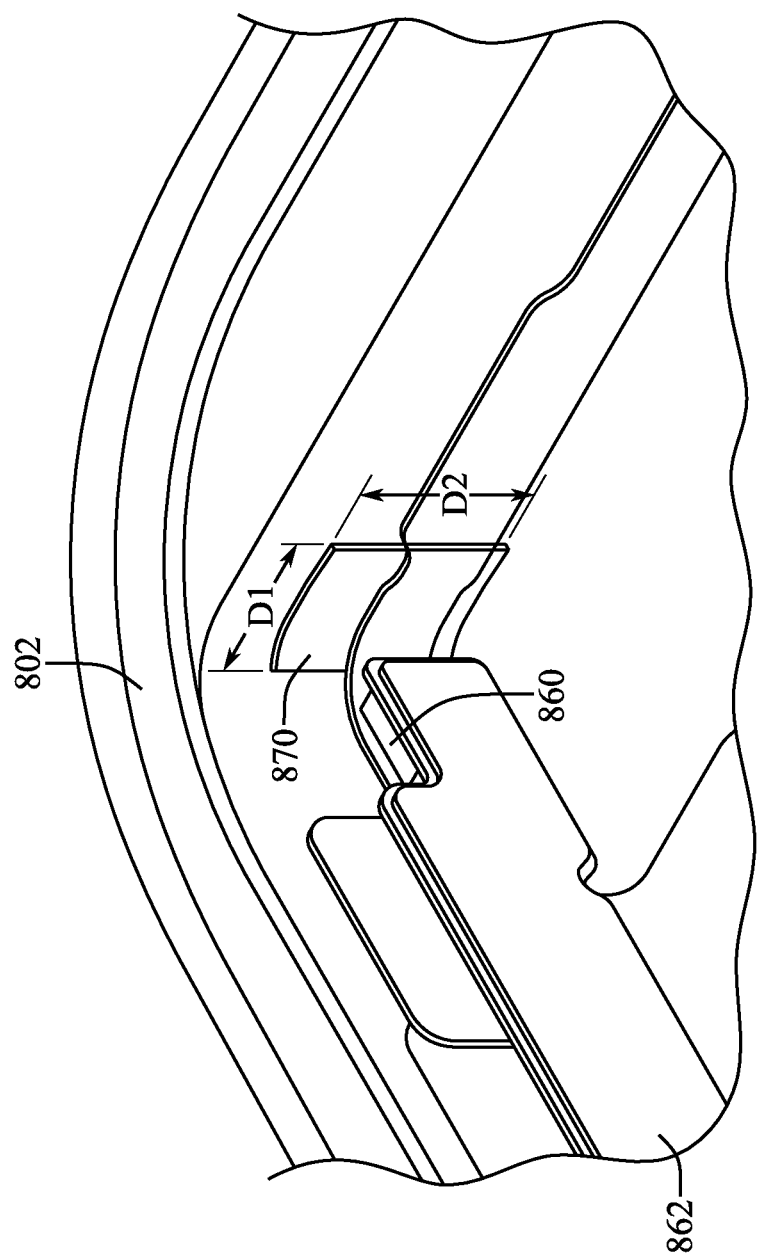
FIG. 10C shows a perspective view of a portion of the electronic device of FIG. 10A.

FIG. 10C illustrates a perspective view of a portion of the internal volume of the device 800 including the magnetometer 860 held in a desired location by the bracket 862, and the distortion shield component 870 disposed between the magnetometer 860 and an attachment feature, as described herein. In some examples, the distortion shield component 870 can have a first dimension D1 that is larger than the corresponding dimension of the magnetometer 860, and a second dimension D2 that is larger than the corresponding dimension of the magnetometer 860. Thus, in some examples, the distortion shield component 870 can have a surface area larger than the magnetometer 860. In some examples, the distortion shield component 870 can have a shape or a profile that can correspond to a shape or a profile of the housing 802 or components adjacent to the magnetometer 860. In some examples, the distortion shield component 870 can have a shape or a profile that can provide a desired amount of magnetic distortion, as described herein. In some examples, the distortion shield component 870 can have any desired shape, size, or profile. In some examples, the distortion shield component 870 can be non-planar.

Any of the features or aspects of the devices, components, and methods discussed herein can be combined or included in any varied combination. For example, the design, shape, and position of a magnetometer and/or a shielding component of an electronic device are not limited in any way and can be formed and operated by any number of processes, including those discussed herein. A magnetometer of an electronic device can be calibrated by any combination of the processes and methods described herein, including by portions of the processes described herein and combinations of portions of the processes described herein. Additionally, any number and variety of calibration or compensation processes for a magnetometer can be used in any desired combination. Additionally, the components and methods described herein can be included in any desired device.

To the extent applicable to the present technology, gathering and use of data available from various sources can be used to improve the delivery to users of invitational content or any other content that may be of interest to them. The present disclosure contemplates that in some instances, this gathered data may include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates examples in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

As used herein, the terms exterior, outer, interior, inner, top, and bottom are used for reference purposes only. An exterior or outer portion of a component can form a portion of an exterior surface of the component but does not necessarily form the entire exterior of outer surface thereof. Similarly, the interior or inner portion of a component can form or define an interior or inner portion of the component but can also form or define a portion of an exterior or outer surface of the component. A top portion of a component can be located above a bottom portion in some orientations of the component, but can also be located in line with, below, or in other spatial relationships with the bottom portion depending on the orientation of the component.

Various inventions have been described herein with reference to certain specific embodiments and examples. However, they will be recognized by those skilled in the art that many variations are possible without departing from the scope and spirit of the inventions disclosed herein, in that those inventions set forth in the claims below are intended to cover all variations and modifications of the inventions disclosed without departing from the spirit of the inventions.

The terms "including:" and "having" come as used in the specification and claims shall have the same meaning as the term "comprising."

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A method of calibrating a magnetometer of an electronic device, comprising:
   detecting a change in a magnetism of the electronic device;
   collecting a first magnetic field data from the magnetometer at a sampling frequency of at least 1 hertz (Hz);
   generating an elliptical calibration model based at least partially on the collected first magnetic field data;
   collecting a second magnetic field data from the magnetometer; and
   fitting the collected second magnetic field data to a sphere using the elliptical calibration model to calibrate the magnetometer of the electronic device.

2. The method of claim 1, wherein collecting the first magnetic field data comprises collecting magnetic field data for at least 2 minutes.

3. The method of claim 1, wherein the electronic device is moved about an axis while collecting the first magnetic field data.

4. The method of claim 1, further comprising determining a strength and a direction of Earth's magnetic field based at least partially on the sphere.

5. The method of claim 1, wherein detecting the change in the magnetism comprises detecting a change in a component attached to the electronic device.

6. A method of calibrating a magnetometer of an electronic device, comprising:
   detecting a change in a magnetism of the electronic device;
   collecting magnetic field data from the magnetometer;
   generating an elliptical calibration model based at least partially on detecting the change; and
   fitting the collected magnetic field data to a sphere using the elliptical calibration model to calibrate the magnetometer of the electronic device.

7. The method of claim 6, wherein detecting the change in the magnetism comprises detecting when a component is removably attached to the electronic device.

8. The method of claim 7, wherein collecting magnetic field data further comprises compensating for movement of the component relative to the electronic device while collecting magnetic field data.

9. The method of claim 7, wherein the component comprises at least one of a securement band or a case.

10. The method of claim 6, wherein the change in the magnetism comprises a change in a soft magnetism of the electronic device.

11. The method of claim 6, wherein detecting the change in the magnetism comprises receiving a response to a prompt.

12. The method of claim 6, wherein collecting magnetic field data comprises collecting magnetic field data in a background.

13. The method of claim 6, wherein collecting magnetic field data comprises prompting a user to perform a data collection procedure.

14. The method of claim 6, wherein collecting magnetic field data comprises collecting magnetic field data from the magnetometer at a sampling frequency of at least 1 Hz.

15. The method of claim 6, wherein the electronic device comprises a smartwatch.

16. A wearable electronic device, comprising:
a housing defining an internal volume;
a component attachment feature;
a magnetometer disposed in the internal volume; and
a distortion shield component disposed in the internal volume between the magnetometer and the component attachment feature,
wherein the wearable electronic device is configured to collect magnetic field data and fit the magnetic field data to a sphere using an elliptical calibration model to calibrate the magnetometer of the wearable electronic device.

17. The wearable electronic device of claim 16, wherein the wearable electronic device comprises a smartwatch.

18. The wearable electronic device of claim 17, wherein the component attachment feature is configured to removably engage a securement band.

19. The wearable electronic device of claim 16, wherein the distortion shield comprises:
a polymer material; and
a magnetic powder disposed in the polymer material.

20. The wearable electronic device of claim 16, wherein:
the component attachment feature is disposed on an exterior surface defined by the housing; and
the magnetometer is disposed adjacent to an interior surface of the housing opposite the component attachment feature.

* * * * *